(12) United States Patent
Tanaka

(10) Patent No.: US 8,053,860 B2  
(45) Date of Patent: Nov. 8, 2011

(54) SEMICONDUCTOR DEVICE AND MANUFACTURING METHOD OF THE SAME

(75) Inventor: Masayasu Tanaka, Tokyo (JP)

(73) Assignee: NEC Corporation, Tokyo (JP)

( * ) Notice: Subject to any disclaimer, the term of this patent is extended or adjusted under 35 U.S.C. 154(b) by 68 days.

(21) Appl. No.: 12/599,706

(22) PCT Filed: Apr. 14, 2008

(86) PCT No.: PCT/JP2008/057305  
§ 371 (c)(1), (2), (4) Date: Dec. 11, 2009

(87) PCT Pub. No.: WO2008/139815  
PCT Pub. Date: Nov. 20, 2008

(65) Prior Publication Data  
US 2010/0219499 A1 Sep. 2, 2010

(30) Foreign Application Priority Data  
May 11, 2007 (JP) .................... 2007-126803

(51) Int. Cl.  
*H01L 21/70* (2006.01)

(52) U.S. Cl. ............. 257/506; 257/374; 257/E29.02; 257/E21.546; 257/382; 257/377; 257/E21.593; 438/435; 438/296; 438/655

(58) Field of Classification Search ........... 257/506, 257/374, E29.02, E21.546, 382, 377, E21.593; 438/435, 296, 655  
See application file for complete search history.

(56) References Cited

U.S. PATENT DOCUMENTS

| 2006/0121688 A1* | 6/2006 | Ko et al. ............ 438/439 |
| 2007/0032026 A1* | 2/2007 | Ong et al. ........... 438/301 |

FOREIGN PATENT DOCUMENTS

| JP | 10-233371 A | 9/1998 |
| JP | 11-177084 A | 7/1999 |
| JP | 11-214688 A | 8/1999 |
| JP | 11-312804 A | 11/1999 |
| JP | 2005175299 A | 6/2005 |

OTHER PUBLICATIONS

International Search Report for PCT/JP2008/057305 mailed Jul. 15, 2008.  
T. Ohguro et al., "Nitrogen-doped nickel monosilicide technique for deep submicron CMOS salicide", Proceedings of International Electron Devices Meeting (1995), 18.3.1-18.3.4.  
L.P. Ren et al., "Advanced Silicide for Sub-0.18μm CMOS on Ultrathin (35nm) SOI", IEEE International SOI Conference, Oct. 1999, p. 88-89.

* cited by examiner

*Primary Examiner* — Tu-Tu Ho

(57) ABSTRACT

An excessive metallic film on a device isolation region is prevented from contributing to silicidation in an end of a source-drain diffusion layer region to thereby form a silicide film with uniform film thickness. There are sequentially conducted a step of forming a device isolation region 3 in a substrate 1 including a silicon layer at least in a surface thereof and filling a first insulator in the device isolation region 3, a step of making height of an upper surface of the first insulator less than height of an upper surface of the substrate 1 and forming a sidewall film 10 on a sidewall of the device isolation region 3, and a step of depositing a metallic film 11 on the substrate 1 and then conducting silicidation through a thermal process.

8 Claims, 3 Drawing Sheets

(a)

-- PRIOR ART --

(b)

-- PRIOR ART --

SEMICONDUCTOR DEVICE AND MANUFACTURING METHOD OF THE SAME

This application is the National Phase of PCT/JP2008/057305, filed Apr. 14, 2008, which is based upon and claims the benefit of priority from Japanese patent application No. 2007-126803, filed on May 11, 2007, the disclosure of which is incorporated herein in its entirety by reference.

TECHNICAL FIELD

The present invention relates to a semiconductor device and a method of manufacturing the same, and in particular, to a technique of forming a silicide film having uniform film thickness.

RELATED ART

Recently, as semiconductor devices are constructed in finer structure, a technique to form a thin, uniform thin film has been required. For example, for an MISFET, to suppress the short-channel effect, it is required that the source-drain diffusion layer region is shallow and a low-resistive silicide film having a small, uniform film thickness is formed in the source-drain diffusion layer region. This is because it is required, in order to suppress the short-channel effect, that the source-drain diffusion layer region is shallow to suppress expansion of the depletion layer which extends from the drain region to the source region beneath the gate electrode.

In the MISFET production, for the metallic film as the base of the silicide film, a substance which easily reacts with silicon but less easily reacts with a silicon oxide film and a silicon nitride film is selected. As a result, even when the metal is deposited on the overall surface of a wafer and a thermal process is performed for silicidation, a silicide film is selectively formed only in a device area in which silicon is exposed on the surface; on the other hand, the silicide film is not formed in a device isolation area covered with the silicon oxide film. The metallic film deposited on the device isolation area remains even after the thermal process; hence, by removing the metallic film by acid cleaning or the like after the silicide film formation, insulation between the devices can be secured.

The silicide film can be more stably formed as the temperature is higher in the thermal process. At a low temperature, there possibly appears a situation of occurrence of a problem in which a non-reacted portion remains partially in the area. However, at a too high temperature, the crystal phase of silicide makes a transition; it is hence desirable to set the temperature to a value as high as possible in a temperature range in which the transition does not take place. However, the higher the temperature is, the more the silicidation is promoted, which increases the danger that the silicide film becomes thicker and exceeds the source-drain junction. On the other hand, the maximum value of thickness of the silicide film is determined by the maximum quantity of the metal contributive to the reaction. That is, it is determined by thickness of the deposited metallic film. Therefore, even in a high-temperature thermal process, a thin silicide film can be formed by decreasing the metallic film thickness. Although this method is a method generally employed to form a thin silicide film, there remains a problem with regard to uniformness of the film thickness.

It is known that the silicidation speed depends of the crystal orientation of the silicon substrate. For example, in nickel silicide, the growing speed is lower on the (100) surface than on the (111) surface. Hence, when nickel silicide is formed on a silicon substrate having the (100) surface, spike-shaped projections are formed in the (111) direction, which makes the film thickness non-uniform in some cases. When spike-shaped projections are formed, there arises a problem in the MISFET, i.e., such projections pierce through the source-drain junction to increase the junction leakage. Also, even if the projections do not pierce through the source-drain junction, there occurs a problem in which electric-field concentration takes place at tip ends of spike shapes to increase the junction leakage current in the source-drain region.

To solve the problem of the film thickness uniformness described above, Non-Patent Document 1 has reported a method in which in the sputtering of a metallic film, the metal is sputtered while nitriding a silicon substrate in plasma of argon and nitrogen. It has been reported that according to this method, in a thermal process step to form silicide, nitrogen segregates on an interface between a siliside film and the silicon substrate, and hence due to the effect of strain, non-uniformity such as that of spike shapes does not appear easily.

Further, as described in Non-Patent Document 2, it has been reported that by implanting ions of Ge and Ar into a surface of a semiconductor substrate to amorphize the surface, stress taking place at reaction is mitigated to thereby improve the uniformness.

Moreover, Patent Document 1 describes an invention in which the surface height of an insulation film on a device isolation region adjacent to a source-drain region is less than that of a semiconductor substrate forming the source-drain region and a stopper section is disposed in a portion on an insulation film on the device isolation region, to thereby grow, in a predetermined direction, an epitaxial silicon film to be formed on the source-drain region.

Non-Patent Document 1: T. Ohguro et al., Proceedings of International Electron Devices Meeting (1995)
Non-Patent Document 2: L. P. Ren et al., IEEE International SOI Conference (1999)
Patent Document 1: Japanese Patent Laid-Open Pub. No. 2005-175299

Next, from a viewpoint of the present invention, consideration will be given to the prior art. The inventions described in Non-Patent Documents 1 and 2 are accompanied by a problem wherein although it is possible to make the film thickness of the silicide film uniform on areas of a silicon substrate in which an LSI circuit pattern or the like is not present such as a gate electrode and a device isolation area, the advantage is not obtained for a particular pattern in an example in which an LSI circuit pattern or the like is present. Further, it has been clarified that non-uniformness of the film thickness occurs even by use of the technique described in Patent Document 1.

That is, as shown in FIG. 1 (b), according to an example of a source-drain diffusion layer of an MISFET, the prior art cannot cope with the problem of non-uniformness in which in the neighborhood of an interface between the source-drain diffusion layer region and the device isolation region, the silicide thickness is larger when compared with the silicide thickness in the source-drain diffusion layer region.

BRIEF SUMMARY OF THE INVENTION

The cause of occurrence of this problem will be considered by using (a) and (b) of FIG. 1. FIG. 1 (a) shows cross-sectional structure of an MISFET after deposition of a metallic film in silicide formation. The cause of occurrence is that first, the metallic film on the device isolation region contributes to the silicidation in the end of the source-drain diffusion layer region. That an excessive metallic film on the device isolation region contributes to the silicidation in the end of the source-drain diffusion layer region is equivalently that it seems as if the metallic film is deposited thicker only in the end of the source-drain diffusion layer region; hence, the silicide film increases as shown in FIG. 1 (b). In addition, secondly, it is assumed that the cause resides in that a portion of the upper section of the side surface of the source-drain diffusion layer region is exposed in the production process and the silicidation proceeds therefrom by consuming the metallic film on the device isolation region.

The invention described in Patent Document 1 is a configuration in which step structure is arranged in a device isolation region and a source-drain diffusion layer region; however, when a metallic film is deposited on the source-drain diffusion layer region, metal is deposited also on a portion of the device isolation region; hence, the problem as shown in FIG. 1 (b) cannot be removed.

In consideration of the above problems, the present invention aims to provide a method of manufacturing a semiconductor device, naturally including an MISFET semiconductor device, of forming a silicide film having uniform film thickness.

To achieve the object, in a first aspect of the present invention, there is provided a semiconductor device manufacturing method, comprising a step of disposing, for a silicidation target region on a substrate surface, an insulation film sidewall with predetermined depth along at least a portion of a periphery of the region and a silicidation step of siliciding the region.

In the first aspect, as the step of disposing the insulation film sidewall for structure in which at least the portion of the periphery of the region can form a boundary for at least a portion of an opening end of a device isolation trench and the device isolation trench is filled with an insulation layer up to the predetermined depth from a bottom of the trench, there may be conducted a step of disposing an insulation film on a sidewall of the device isolation trench from the opening end of the device isolation trench to an upper surface of the insulation layer.

Further, in one other aspect of the present invention, there is provided a semiconductor device, comprising an insulation film sidewall disposed with predetermined depth along at least a portion of a periphery of a silicidation target region on a substrate surface and a silicide film formed on the region of the substrate surface.

In the other aspect, at least the portion of the periphery of the region can form a boundary for at least a portion of an opening end of a device isolation trench and the device isolation trench is filled with an insulation layer up to the predetermined depth from a bottom of the trench, and it is possible to dispose the insulation film on a sidewall of the device isolation trench from the opening end of the device isolation trench to an upper surface of the insulation layer.

In accordance with the present invention, it is possible to form a silicide film having uniform film thickness on a semiconductor device.

DETAILED DESCRIPTION OF THE INVENTION

Figure 1:
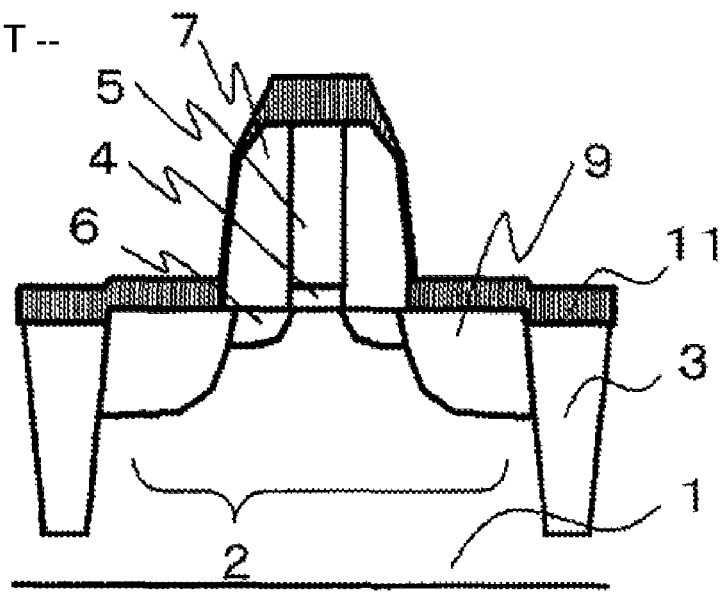
FIG. 1 includes cross-sectional views showing structure of a conventional semiconductor device.
Figure 1:
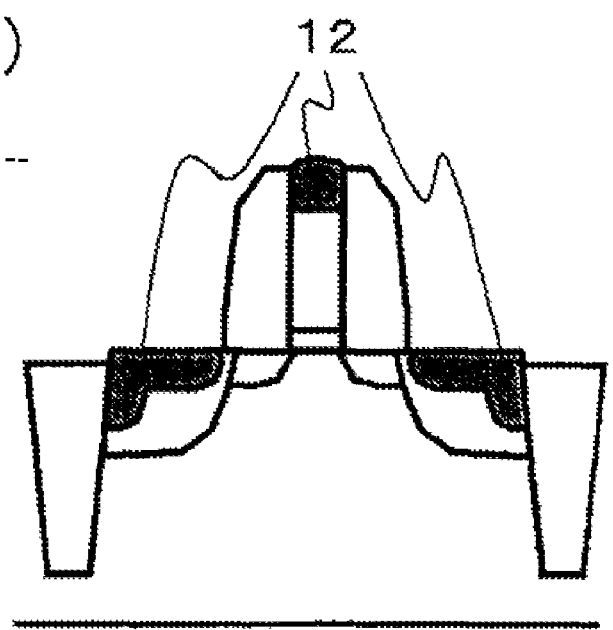

Description will now be given of a best mode for carrying out the present invention. By using, for example, an MISFET as the semiconductor device, the semiconductor device manufacturing method of the present invention includes a step of disposing an insulation film sidewall with determined depth along at least a portion of a periphery of a silicidation target region, i.e., a source-drain diffusion layer and a gate electrode on a substrate and a step of siliciding the silicidation target region through a thermal process.

Additionally, in a second aspect of the present invention, there is provided a semiconductor device manufacturing method of sequentially conducting a step of forming a trench in a substrate including a silicon layer at least in a surface thereof and filling a first insulator in the trench, a step of making height of an upper surface of the first insulator less than height of an upper surface of the substrate and forming a second insulator on a sidewall of the trench, and a step of depositing a metallic film on the substrate and then conducting a thermal process.

In the above second aspect, it is also possible to sequentially carry out steps implemented by reversing the step of filling the first insulator and the step of forming the second insulator, that is, a step of forming a trench in a substrate including a semiconductor layer at least in a surface thereof and forming a second insulator on a sidewall of the trench, a step of filling a first insulator in the trench, a step of making height of an upper surface of the first insulator less than height of an upper surface of the substrate, and a step of depositing a metallic film on the substrate and then conducting a thermal process.

When the semiconductor device manufacturing method of the second aspect is applied to an MISFET semiconductor device, there is included a step of, after depositing the metallic film on the substrate and before the step of conducting the thermal process, forming a gate electrode via a gate insulation film on the substrate and introducing impurities in the substrate by ion implantation using the gate electrode as a mask.

Moreover, when it is applied to an MISFET semiconductor device, there may be included a step of amorphizing the surface of the substrate by ion implantation after the step of introducing impurities by ion implantation.

Incidentally, in the semiconductor device manufacturing method of the second aspect, it is favorable that the metallic film favorably has thickness equal to or less than difference between the height of the upper surface of the first insulator and that of the upper surface of the substrate. Further, the angle between the sidewall of the trench and the substrate favorably ranges from 70° to 110°.

In the semiconductor device manufacturing methods of the first and second aspects, it is favorable that the metallic favorably comprises one of or a plurality of elements selected from a group including Ni, Pt, Co, Ti, Er, and Yb.

Further, in the semiconductor device manufacturing methods of the first and second aspects, it is favorable that the first insulator is a silicon oxide film and the second insulator is either one of a silicon oxide film, silicon nitride film, and a lamination film including a silicon oxide film and silicon nitride film.

Also, in the semiconductor device manufacturing methods of the first and second aspects, it is favorable that the metallic film is deposited using a physical vapor deposition method.

In the step of the embodying mode, since an insulation film sidewall with determined depth is formed along at least a portion of a periphery of a silicidation target region, it is possible to suppress silicidation from an end of the silicidation target region. Therefore, the siliside film is not increased in the end of the silicidation target region, and it is possible to form a siliside film with uniform film thickness.

EMBODIMENTS

Embodiment 1

Description will be given of a first embodiment of the present invention by referring to drawings ranging from FIG. 2 (a) to FIG. 2 (f). As FIG. 2 (a) shows, trenches are dug in a silicon substrate 1 by use of a highly vertical etching technique and then a first insulator is filled therein to form a device isolation region 3 and a device region 2. Here, it is favorable that the angle between a sidewall of the trench and the substrate 1 is almost the right angle to the maximum extent and is favorably formed to be in a range from 70° to 110°. As the first insulator, a silicon oxide film is employed here. Next, a gate insulation film 4 and a gate electrode 5 are formed in the device region 2; using the gate electrode 5 as a mask, impurity elements are introduced therein by ion implantation to form a shallow diffusion layer 6.

Figure 2:
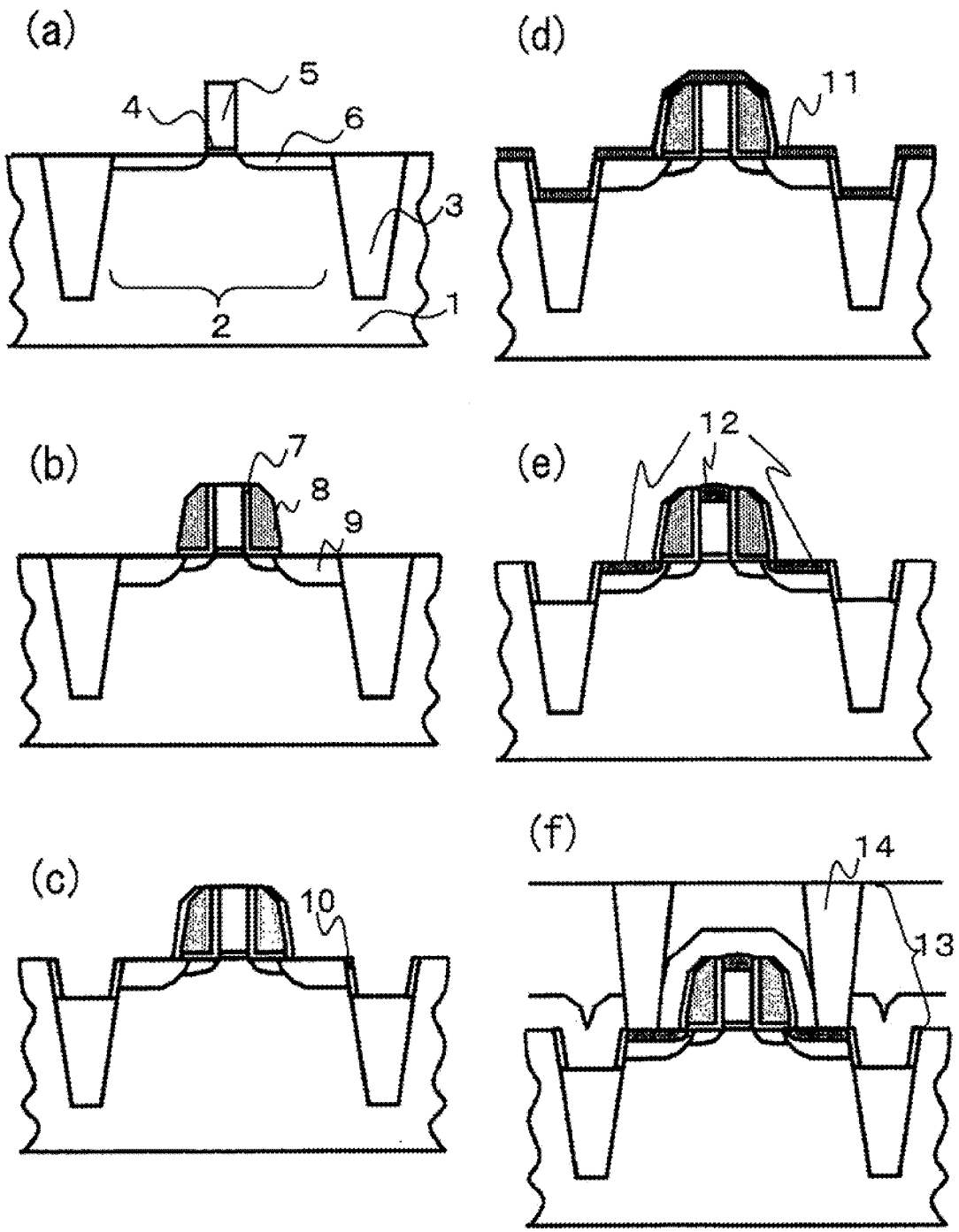
FIG. 2 includes drawings showing a semiconductor device manufacturing method of embodiment 1 of the present invention.

Next, in FIG. 2 (b), a sidewall oxide film 7 having thickness ranging from 1 nm to 20 nm is deposited by LPCVD with a high coating characteristic; similarly, a sidewall nitride film 8 with thickness equal to or more than 1 nm is deposited by LPCVD with a high coating characteristic, and then a lamination sidewall of the oxide film 7 and the nitride film 8 is formed by anisotropic etching. Thereafter, impurities are introduced therein by ion implantation to form a deep diffusion layer 9 through an impurity activating thermal process.

Next, in FIG. 2 (c), the device isolation region 3 is etched by use of a solution having high selectivity for silicon and a nitride film: the silicon oxide film filled in the device isolation region 3 is etched to form difference in height in the diffusion layer 9. Quantity of etching is favorably equal to or more than 5 nm. The difference in height is formed by wet etching in this case; however, if the difference in height can be formed without damaging any region other than the filled silicon oxide film, it is also possible to employ another scheme such as dry etching according to necessity. After this point, a second insulator is deposited by the CVD method, and then this film is etched with high anisotropy to form a sidewall film 10 of the second insulator on a sidewall of the diffusion layer 9. As the second insulator, a silicon oxide film is used here; however, it may be a silicon nitride film or a lamination film including a silicon nitride film and silicon oxide film.

Next, as FIG. 2 (d) shows, to stably form the silicide, there may be conducted if necessary a process in which Ge or Si ions are implanted in the upper-most surface of the silicon substrate to amorphize a region thereof at least 10 nm apart from the surface. Thereafter, a pre-process including APM cleaning and DHF cleaning is carried out. However, it is to be noted that the sidewall film 10 is slightly etched in the pre-process. It is desirable that the thickness of the sidewall film 10 has a margin for the etching in the pre-process. If the thickness of the sidewall film 10 is too small, metal diffuses in the silicide block film to silicide the sidewall in the silicide formation; hence, a certain thickness is required. On the other hand, if the thickness of the sidewall film 10 is too large, excessive metal which contributes to silicidation is deposited on the silicide block film in the silicide formation; it is not possible to form thin silicide in an end of the device isolation region 3. Therefore, the thickness of the silicide block film before the pre-process is favorably set to range from 1 nm to 10 nm.

After this point, a metallic film 11 is deposited by using a Physical Vapor Deposition (PVD) method with high directivity. The use of the PVD method with high directivity enhances verticality of the film thus formed. Further, the angle between the sidewall of the trench and the silicon substrate 1 is formed to be almost the right angle; hence, due to the multiplier effect of this and the deposition of the film in the PVD method with high directivity, it is possible to reduce the film deposited on the trench side surface. And therefore, it is possible to reduce excessive metal which contributes to the silicidation in the end of the diffusion layer 9. Thickness of the metallic film 11 deposited on the upper surface is set to 15 nm or less in association with the difference in height of the device isolation region 3. In this connection, the metal indicates transition-metal-based material and noble-metal-based material, concretely, it is favorable that the metal includes one of or a plurality of elements selected from a group including Ni, Pt, Co, Ti, Er, and Yb; however, in addition to the elements, it is also possible to employ either one of Sc, V, Cr, Mn, Fe, Y, Zr, Nb, Mo, Tc, Ru, Rh, Pd, Ag, Hf, Ta, W, Re, Os, Ir, and Au. Thereafter, silicidation is caused through a thermal process to form a silicide film 12 on the gate electrode 5 and the deep diffusion layer 9.

Finally, as FIG. 2 (f) shows, an inter-layer insulation film 13 is formed by a low-temperature process such as ordinary temperature CVD, plasma CVD, a contact pattern is formed by a lithography technique; anisotropic etching is performed thereon, and contact metal is filled therein to form a contact 14.

As described above, in the present embodiment, the metallic film 11 existing on the device isolation region 3 is isolated from the diffusion layer by the difference in height of the device isolation region 3 and the sidewall film 10 and hence does not contribute to the silicidation in the end of the diffusion layer. Therefore, it is possible to reduce the increase of the silicide film in the end of the diffusion layer. Consequently, as described above, it is possible to reduce the junction depth of the deep diffusion layer 9 and to produce an MISFET having an excellent short-channel characteristic.

In addition, the semiconductor device manufacturing method above is not limited to a situation in which a silicide film is formed in the source-drain diffusion layer region adjacent to the device isolation region of the MISFET as in the present embodiment, but is applicable in general to a case in which a silicide film is formed, on a substrate including a trench, in a region adjacent to the trench.

Embodiment 2

Figure 3:
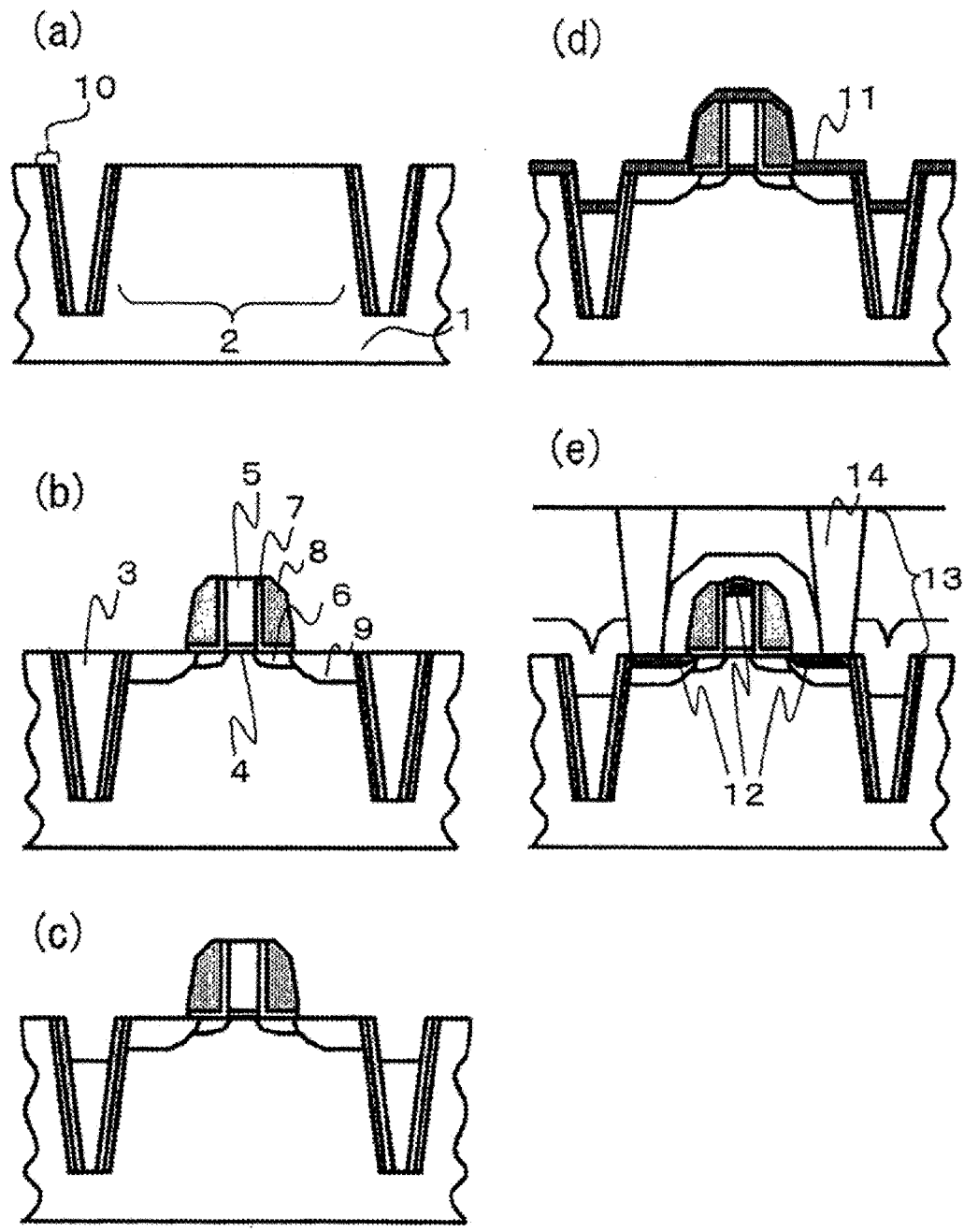
FIG. 3 includes drawings showing a semiconductor device manufacturing method of embodiment 2 of the present invention.

Description will be given of a second embodiment of the present invention by referring to FIGS. 3 (a) to 3 (e). In FIG. 3 (a), a trench is dug by anisotropic etching in a silicon substrate 1 through a mask pattern using a lithography technique; and then, a silicon oxide film ranging from 1 nm to 4 nm is formed on the overall surface thereof by use of a thermal oxidation method; thereafter, a silicon nitride film having a film thickness ranging from 1 nm to 6 nm is uniformly formed by using the LPCVD method; and then, a lamination film of the silicon oxide film and the silicon nitride film is etched by anisotropic etching to form, on a side surface of the trench, a sidewall film 10 of the lamination layer of the silicon oxide film and the silicon nitride film.

In FIG. 3 (b), as in embodiment 1, there are formed a device region 2, a device isolation region 3, a gate insulation film 4, a gate electrode 5, a shallow diffusion layer 6, a lamination layer of a sidewall oxide film 7 and a sidewall nitride film 8, and a deep diffusion layer 9.

Next, in FIG. 3 (c), the device isolation region 3 is etched by use of a solution having high selectivity for silicon and a nitride film: the silicon oxide film filled in the device isolation region 3 is etched to form difference in height in the diffusion layer 9. Here, as in embodiment 1, it is only required to form the difference in height, and it is also possible to employ another scheme such as dry etching according to necessity. Quantity of etching is favorably equal to or more than 15 nm. In this situation, the sidewall film 10 on the side surface of the diffusion layer 9 is coated with the silicon nitride film and hence is not etched even if the DHF process is carried out.

Next, in FIG. 3 (d), a pre-process similar to that of embodiment 1 is conducted such that a metallic film 11 is deposited by a Physical Vapor Deposition (PVD) method with high directivity as in embodiment 1. Thereafter, silicidation is caused through a thermal process to form a silicide film 12 on the gate electrode 5 and the deep diffusion layer 9. Next, in FIG. 3 (e), an inter-layer insulation film 13 is formed by a low-temperature process such as ordinary temperature CVD or plasma CVD, a mask pattern is formed by a lithography technique; anisotropic etching is performed thereon, and contact metal is filled therein to form a contact 14.

In accordance with the semiconductor device manufacturing method of embodiment 2, as in the situation of embodiment 1, the metallic film 11 existing on the device isolation region 3 is isolated from the diffusion layer by the difference in height of the device isolation region 3 and the sidewall film 10 and hence does not contribute to the silicidation in the end of the diffusion layer. Therefore, it is possible to reduce the increase of the silicide film in the end of the diffusion layer. Consequently, as described above, it is possible to reduce the junction depth of the deep diffusion layer 9 is formed and to produce an MISFET having an excellent short-channel characteristic.

Additionally, the semiconductor device manufacturing method above is not limited to a situation in which a silicide film is formed in the source-drain diffusion layer region adjacent to the device isolation region of the MISFET as in the present embodiment, but is applicable in general to a case in which a silicide film is formed, on a substrate including a trench, in a region adjacent to the trench.

The invention claimed is:

1. A semiconductor device manufacturing method of sequentially conducting:

a step of forming a trench in a substrate including a silicon layer at least in a surface thereof and filling a first insulator in the trench;

a step of making height of an upper surface of the first insulator less than height of an upper surface of the substrate and forming a second insulator on a sidewall of the trench;

a step of depositing a metallic film on the substrate; and forming a gate electrode via a gate insulation film on the substrate and introducing impurities in the substrate by ion implantation using the gate electrode as a mask and then conducting silicidation thereon through a thermal process.

2. A semiconductor device manufacturing method in accordance with claim 1, characterized by comprising a step of amorphizing the surface of the substrate by ion implantation after the step of introducing impurities by ion implantation.

3. A semiconductor device manufacturing method in accordance with claim 1, characterized in that the metallic film has thickness equal to or less than difference between the height of the upper surface of the first insulator and that of the upper surface of the substrate.

4. A semiconductor device manufacturing method in accordance with claim 1, characterized in that the metallic film comprises one of or a plurality of elements selected from a group including Ni, Pt, Co, Ti, Er, and Yb.

5. A semiconductor device manufacturing method of sequentially conducting:

a step of forming a trench in a substrate including a silicon layer at least in a surface thereof and forming a second insulator on a sidewall of the trench;

a step of filling a first insulator in the trench;

a step of making height of an upper surface of the first insulator less than height of an upper surface of the substrate;

a step of depositing a metallic film on the substrate; and forming a gate electrode via a gate insulation film on the substrate and introducing impurities in the substrate by ion implantation using the gate electrode as a mask and then conducting silicidation thereon through a thermal process.

6. A semiconductor device manufacturing method in accordance with claim 5, characterized by comprising a step of amorphizing the surface of the substrate by ion implantation after the step of introducing impurities by ion implantation.

7. A semiconductor device manufacturing method in accordance with claim 5, characterized in that the metallic film has thickness equal to or less than difference between the height of the upper surface of the first insulator and that of the upper surface of the substrate.

8. A semiconductor device manufacturing method in accordance with claim 5, characterized in that the metallic film comprises one of or a plurality of elements selected from a group including Ni, Pt, Co, Ti, Er, and Yb.

* * * * *